US007804705B2

(12) United States Patent
Iwata et al.

(10) Patent No.: US 7,804,705 B2
(45) Date of Patent: Sep. 28, 2010

(54) SEMICONDUCTOR DEVICE, LIQUID CRYSTAL DISPLAY DEVICE AND ELECTRONIC EQUIPMENT

(75) Inventors: Hiroshi Iwata, Nara-ken (JP); Yoshiji Ohta, Kashiwara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 297 days.

(21) Appl. No.: 12/022,785

(22) Filed: Jan. 30, 2008

(65) Prior Publication Data

US 2009/0237154 A1 Sep. 24, 2009

(51) Int. Cl.
*G11C 11/00* (2006.01)

(52) U.S. Cl. .................................. 365/154; 365/189.05

(58) Field of Classification Search ................. 365/154, 365/189.05

See application file for complete search history.

(56) References Cited

U.S. PATENT DOCUMENTS 5,053,996 A * 10/1991 Slemmer .................... 365/156
6,340,939 B1 * 1/2002 Dedic ......................... 341/136
7,332,742 B2 * 2/2008 Miyake et al. ................ 257/59

FOREIGN PATENT DOCUMENTS

JP 63-34953 A 2/1988
JP 4-195123 A 7/1992
JP 4-208711 A 7/1992
JP 11-338439 A 12/1999
JP 2003-58107 A 2/2003

* cited by examiner

*Primary Examiner*—Son Dinh
*Assistant Examiner*—Nam Nguyen
(74) *Attorney, Agent, or Firm*—Birch, Stewart Kolasch & Birch, LLP

(57) ABSTRACT

The semiconductor device of the present invention has a circuit block in which m (m is an integer of not smaller than two) sets of first through m-th transistor columns where two or more transistors are connected in series, one terminal of the first through m-th transistor columns is connected to a first output node, and the other terminal of the first through m-th transistor columns is connected to a second output node. A control signal for substantially simultaneously turning on and off all the transistors of the first through m-th transistor columns is inputted to the control input terminals of the transistors of the first through m-th transistor columns.

11 Claims, 13 Drawing Sheets

SEMICONDUCTOR DEVICE, LIQUID CRYSTAL DISPLAY DEVICE AND ELECTRONIC EQUIPMENT

This Nonprovisional application claims priority under 35 U.S.C. §119(a) on Patent Application No. 2007-020865 filed in Japan on Jan. 31, 2007, the entire contents of which are hereby incorporated by reference.

BACKGROUND OF THE INVENTION

The present invention relates to semiconductor devices, liquid crystal display devices and electronic equipment and relates, in particular, to a semiconductor device whose circuit blocks are constructed of transistor groups where individual transistors have variations in an on-state current and an off-state current, and a liquid crystal display device and electronic equipment, which employ the semiconductor device.

Lately, there is a liquid crystal display device equipped with a semiconductor circuit constructed of transistors formed on a glass substrate (refer to, for example, JP H04-195123 A) as electronic equipment that employs a semiconductor device. Moreover, a circuit including transistors and so on will presumably be formed also on a flexible substrate such as plastics substrate, which can be processed by a low temperature process in the future.

The transistors formed on a glass substrate or a plastics substrate as described above have variations in the on-state current and the off-state current larger than those of the transistors formed on a silicon substrate, causing a problem that the product yield is reduced. Power consumption increases when, for example, the on-state current is excessively large, while the driving abilities of the transistors become insufficient and the circuit does sometimes not correctly operate when the on-state current is excessively small. Moreover, a circuit design balance is lost in either case, resulting in reducing the operation margin. Otherwise, when the off-state current is excessively large, a standby current increases or the signals and electric charges leak, resulting in a fail in holding data or incorrect circuit operation.

As a typical solution approach to the conventional transistor defects as described above, there is a semiconductor device whose transistors are connected in series or connected in parallel.

However, the conventional semiconductor device employing the way of connecting the transistors in series is effective for the off-state current failure because the current can be turned off when either one of the transistors is normal, but is inappropriate for the on-state current failure because the desired current does not flow when either one of the transistors suffers an on-state current failure and particularly when the current is small. Moreover, the semiconductor device employing the way of connecting the transistors in parallel is effective for the failure of a small on-state current because a normal current flows when either one of the transistors is normal particularly, but is inappropriate for the off-state current failure because the current cannot be turned off when either one of the transistors is defective.

SUMMARY OF THE INVENTION

An object of the present invention is to provide a semiconductor device capable of suppressing low the fraction defective of circuit blocks constructed of a transistor group while suppressing variations in the on-state current and the off-state current even if the fraction defective of each individual transistor is high, as well as a liquid crystal display device that employs the semiconductor device and electronic equipment that employs the semiconductor device.

In order to solve the above problems, a semiconductor device of the present invention comprises:

a circuit block, which has an m (m is an integer of not smaller than two) sets of first through m-th transistor columns where two or more transistors are connected in series and in which the first through m-th transistor columns have an identical or a varied number of transistors, one terminal of the first through m-th transistor columns is connected to a first output node, and the other terminal of the first through m-th transistor columns is connected to a second output node, wherein a control signal for substantially simultaneously turning on and off all the transistors of the first through m-th transistor columns is inputted to a control input terminal of the transistors of the first through m-th transistor columns.

According to the semiconductor device of the above construction, the current can be turned off if any transistor is normal in each of first through m-th transistor columns for the off-state current failure, while a normal current flows when the transistors are normal in at least one of the first through m-th transistor columns for the failure of a small on-state current. Therefore, the fraction defective of the transistor group can be suppressed low in comparison with the case where the circuit block is constructed of one transistor even if the fraction defective of each individual transistor is high, and the shipment yield can be improved.

In one embodiment of the semiconductor device, at least two intermediate nodes of different transistor columns among intermediate nodes of the first through m-th transistor columns of the circuit block are interconnected.

According to the above embodiment, by interconnecting at least two intermediate nodes of different transistor columns among the intermediate nodes of the first through m-th transistor columns, a current flows there, providing a construction advantageous when all the transistors are in the on state. Consequently, the fraction defective can be reduced in a self-aligning manner.

In one embodiment of the semiconductor device, the circuit block comprises an intermediate node interconnection transistor for interconnecting at least two intermediate nodes of different transistor columns among the intermediate nodes of the first through m-th transistor columns, and the control signal for substantially simultaneously turning on and off all the transistors of the first through m-th transistor columns and the intermediate node interconnection transistor is inputted to a control input terminal of the intermediate node interconnection transistor.

According to the above embodiment, when the intermediate node interconnection transistor for interconnecting at least two intermediate nodes of different transistor columns among the intermediate nodes of the first through m-th transistor columns is in the off state, no current flows there, providing a construction advantageous when all the transistors are in the off state. Conversely, when the intermediate node interconnection transistor for interconnecting at least two intermediate nodes of different transistor columns among the intermediate nodes of the first through m-th transistor columns is in the on state, a current flows there, providing a construction advantageous when all the transistors are in the on state. Consequently, the fraction defective can be reduced in a self-aligning manner.

In one embodiment of the semiconductor device, in the circuit block, transistor counts of the first through m-th transistor columns are same n (an integer of not smaller than two), the first through m-th transistor columns have first through (n−1)-th intermediate nodes in order from the one terminal, and the circuit block comprises (n−1)×(m−1) intermediate node interconnection transistors that interconnect a j-th (j=1, 2, . . . , (n−1)) intermediate node of an i-th (i=1, 2, . . . , (m−1)) transistor column with the j-th intermediate node of a (i+1)-th transistor column.

According to the above embodiment, the fraction defective of the transistor group can be suppressed low in comparison with the case where the circuit block is constructed of one transistor even if the fraction defective of each individual transistor is high, and the shipment yield can be improved. Moreover, when the intermediate node interconnection transistor for interconnecting the intermediate nodes of the transistor columns is in the off state, no current flows there, providing a construction advantageous when all the transistors are in the off state. Conversely, when the intermediate node interconnection transistor for interconnecting the intermediate nodes of the transistor columns is in the on state, a current flows there, providing a construction advantageous when all the transistors are in the on state. Consequently, the fraction defective can be reduced in a self-aligning manner.

In one embodiment of the semiconductor device, the circuit block comprises:

the first through m-th transistor columns where two transistors are connected in series; and (m−1) intermediate node interconnection transistors that interconnect an intermediate node of an i-th (i=1, 2, . . . , (m−1)) transistor column with an intermediate node of a (i+1)-th transistor column.

According to the above embodiment, the fraction defective of the circuit block constructed of the transistor group can be suppressed low even if the fraction defective of each individual transistor is high in comparison with the case where the circuit block is constructed of one transistor, and the shipment yield can be improved. Moreover, when the intermediate node interconnection transistor for interconnecting the intermediate nodes of the transistor columns is in the off state, no current flows there, providing a construction advantageous when all the transistors are in the off state. Conversely, when the intermediate node interconnection transistor for interconnecting the intermediate nodes of the transistor columns is in the on state, a current flows there, providing a construction advantageous when all the transistors are in the on state. Consequently, the fraction defective can be reduced in a self-aligning manner. Furthermore, a circuit block of low fraction defective can be provided by a comparatively small circuit constructed of five transistors.

In one embodiment of the semiconductor device, the circuit block comprises:

first through third transistor columns where three transistors are connected in series, the first through third transistor columns having first through third intermediate nodes, respectively, in order from one end;

an intermediate node interconnection transistor for interconnecting the first intermediate node of the first transistor column with the first intermediate node of the second transistor column;

an intermediate node interconnection transistor for interconnecting the second intermediate node of the first transistor column with the second intermediate node of the second transistor column;

an intermediate node interconnection transistor for interconnecting the first intermediate node of the second transistor column with the first intermediate node of the third transistor column; and an intermediate node interconnection transistor for interconnecting the second intermediate node of the second transistor column with the second intermediate node of the third transistor column.

According to the above embodiment, the fraction defective of the transistor group can be suppressed low in comparison with the case where the circuit block is constructed of one transistor even if the fraction defective of each individual transistor is high, and the shipment yield can be improved. Moreover, when the intermediate node interconnection transistor for interconnecting the intermediate nodes of the transistor columns is in the off state, no current flows there, providing a construction advantageous when all the transistors are in the off state. Conversely, when the intermediate node interconnection transistor for interconnecting the intermediate nodes of the transistor columns is in the on state, a current flows there, providing a construction advantageous when all the transistors are in the on state. Consequently, the fraction defective can be reduced in a self-aligning manner. Furthermore, a circuit block of lower fraction defective can be provided by a comparatively small circuit constructed of thirteen transistors, achieving a very low fraction defective.

In one embodiment of the semiconductor device, an n-channel type transistor is employed for every the transistor of the circuit block.

According to the above embodiment, by applying an identical input to the gates of the n-channel type transistors, the transistor group can be put into the off state by, for example, a low-level signal, and the transistor group can be put into the on state by a high-level signal. Therefore, easy control can be achieved.

In one embodiment of the semiconductor device, a p-channel type transistor is employed for every the transistor of the circuit block.

According to the above embodiment, by applying an identical input to the gates of the p-channel type transistors, the transistor group can be put into the on state by, for example, a low-level signal, and the transistor group can be put into the off state by a high-level signal. Therefore, easy control can be achieved.

In one embodiment of the semiconductor device, an inverter is comprised of the circuit block that employs a p-channel type transistor and the circuit block that employs an n-channel type transistor.

According to the above embodiment, each of the circuit blocks can be operated with low fraction defective when the transistors that form the circuit block employing the p-channel type transistor and the circuit block employing the n-channel type transistor are turned either on or off. Therefore, an inverter, whose output correctly changes to the low level and the high level with respect to a change to the high level and the low level of the input, can be constituted with high yield.

In one embodiment of the semiconductor device, a non-conjunction circuit is comprised of the circuit block that employs a p-channel type transistor and the circuit block that employs an n-channel type transistor.

According to the above embodiment, each of the circuit blocks can be operated with low fraction defective when the transistors that form the circuit block employing the p-channel type transistor and the circuit block employing the n-channel type transistor are turned either on or off. Therefore, a NAND (non-conjunction) circuit, which outputs the high level and the low level by correct logic with respect to the combinations of the high level and the low level of a plurality of inputs, can be constituted with high yield.

In one embodiment of the semiconductor device, a logic circuit is comprised of the circuit block that employs a p-channel type transistor and the circuit block that employs an n-channel type transistor.

According to the above embodiment, each of the circuit blocks can be operated with low fraction defective when the transistors that form the circuit block employing the p-channel type transistor and the circuit block employing the n-channel type transistor are turned either on or off. Therefore, a logic circuit, which outputs the high level and the low level by correct logic with respect to the combinations of the high level and the low level of a plurality of inputs, can be constituted with high yield.

A liquid crystal display device of the present invention comprises anyone of the semiconductor devices described above, wherein a pixel is connected to the first output node or the second output node of the semiconductor device.

According to the above construction, the fraction defective of the on-state current and the off-state current of TFT (Thin Film Transistor) can be suppressed low by employing the semiconductor device for the TFT. Therefore, an analog signal inputted to the pixels of the LCD can be transmitted accurately at high speed and securely maintained for a definite period.

Electronic equipment of the present invention comprises anyone of the semiconductor devices described above.

According to the above construction, the fraction defective of the circuit block constructed of the transistor group can be suppressed low with a comparatively simple construction, and the shipment yield can be improved. Therefore, electronic equipment with high reliability is obtained.

As is apparent from the above, according to the semiconductor device of the present invention, the circuit block constructed of the transistor group in which the individual transistors are arranged in series or in parallel is used as a transfer gate even if the fraction defective of the individual transistors is high. Therefore, the fraction defective of the on-state current and the off-state current of the transistors can be suppressed low, and the shipment yield can be improved.

Moreover, according to the liquid crystal display device of the present invention, by employing the semiconductor device for the TFT, the fraction defective of the on-state current and the off-state current of TFT (Thin Film Transistor) can be suppressed low. Therefore, an analog signal inputted to the pixels of the LCD can be transmitted accurately at high speed and securely maintained for a definite period.

Moreover, according to the electronic equipment of the present invention, by employing the semiconductor device, the fraction defective of the circuit block constructed of the transistor group can be suppressed low with a comparatively simple construction, and the shipment yield can be improved. Therefore, electronic equipment with high reliability is obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
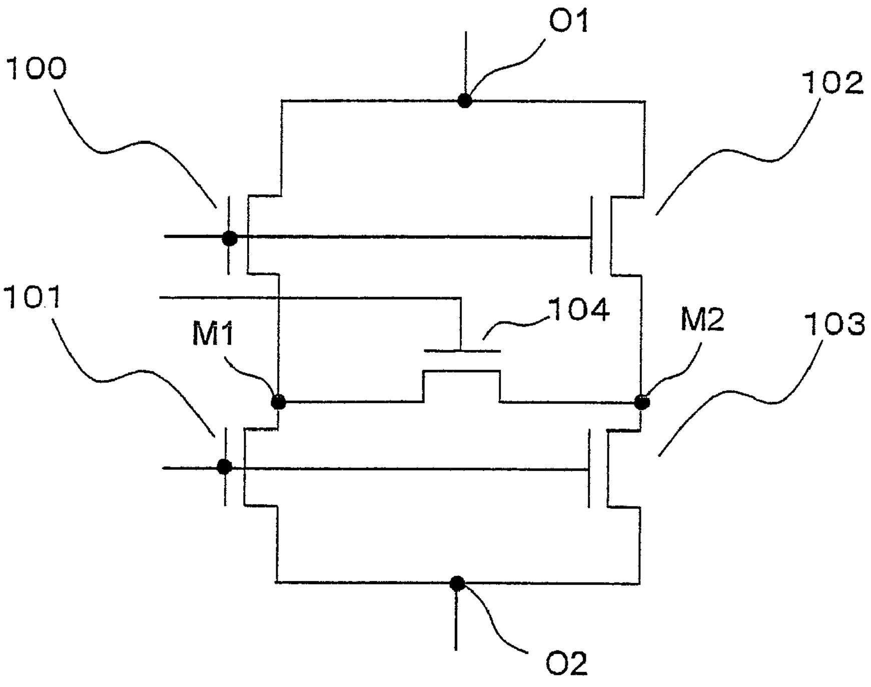
FIG. 1 is a diagram showing a semiconductor device according to a first embodiment of the present invention.

The semiconductor device, the liquid crystal display device and the electronic equipment of the present invention will be described in detail below by the embodiments shown in the drawings.

The First Embodiment

FIG. 1 is a diagram showing a semiconductor device according to the first embodiment of the present invention. As shown in FIG. 1, the semiconductor device has a first transistor column where two n-channel type transistors 100, 101 are connected in series and a second transistor column where two n-channel type transistors 102, 103 are connected in series. One terminal of the first and second transistor columns is connected to a first output node O1, and the other terminal of the first and second transistor columns is connected to a second output node O2, the first and second transistor columns being connected in parallel. Moreover, an intermediate node M1 between the n-channel type transistors 102, 103 of the first transistor column and an intermediate node M2 between the n-channel type transistors 102, 103 of the second transistor column are interconnected via an n-channel type transistor 104. The n-channel type transistor 104 is the intermediate node interconnection transistor. The n-channel type transistors 100, 101, . . . , 104 constitute one circuit block. In the present invention, the circuit block of the construction as described above is used as a transfer gate.

In the semiconductor device, a control signal for simultaneously turning on and off all the transistors 100, 101, . . . ,

104 is inputted to the gates as the control input terminals of all the transistors 100, 101, . . . , 104 of the first and second transistor columns.

It is assumed that each of the individual n-channel type transistors 100, 101, . . . , 103 has a traction defective "e" and an off-state current fraction defective "p". If an operation of one transistor were performed, a fraction defective $\epsilon 0$ would be:

$$\epsilon 0=1-(1-e)\cdot(1-p)$$

and, assuming that e=p=1%, then there holds $$\epsilon 0=1.99\%$$

Thus, when the five n-channel type transistors are all turned on or off by using the construction of the present invention shown in FIG. 1, an on-state current fraction defective $\epsilon 1e$ of the circuit block constructed of the transistor group is:

$$\epsilon 1e=(1-e)(1-(1-e)^2)^2+e(1-(1-e^2)^2)$$

and an off-state current fraction defective $\epsilon 1p$ of the circuit block constructed of the transistor group is:

$$\epsilon 1p=p(1-(1-p)^2)^2+(1-p)(1-(1-p^2)^2)$$

Assuming that e=p=1%, then there holds $$\epsilon 1e=\epsilon 1p\approx 0.0202\%$$

which means that the fraction defective becomes at least about 1/100 that of the operation of one transistor.

Figure 2:
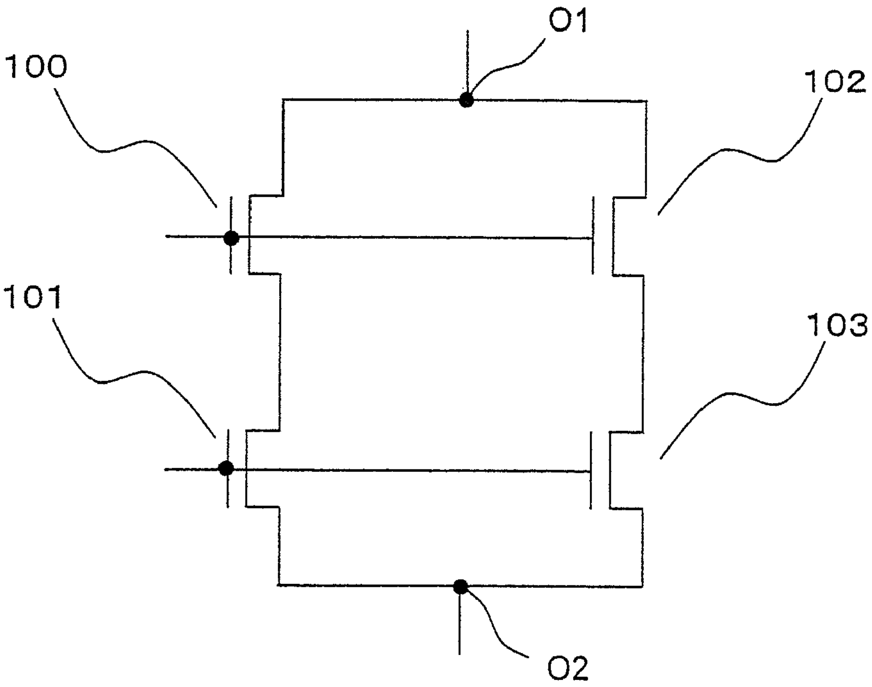
FIG. 2 is a diagram showing a semiconductor device disadvantageous for an on-state current failure.

On the other hand, as shown in FIG. 2, in the case of a circuit block that does not have the n-channel type transistor 104 of FIG. 1, there hold $$\epsilon 2e=(1-(1-e)^2)^2$$

$$\epsilon 2p=1-(1-p^2)^2$$

and, assuming that e=p=1%, then there hold $$\epsilon 2e\approx 0.0396\%$$

$$\epsilon 2p\approx 0.0200\%$$

which means that the fraction defective in the case where the transistors are turned on is disadvantageously increased by about two times. However, if the present invention is applied to the construction of the semiconductor device shown in FIG. 2, the fraction defective of the circuit block can be suppressed low.

Figure 3:
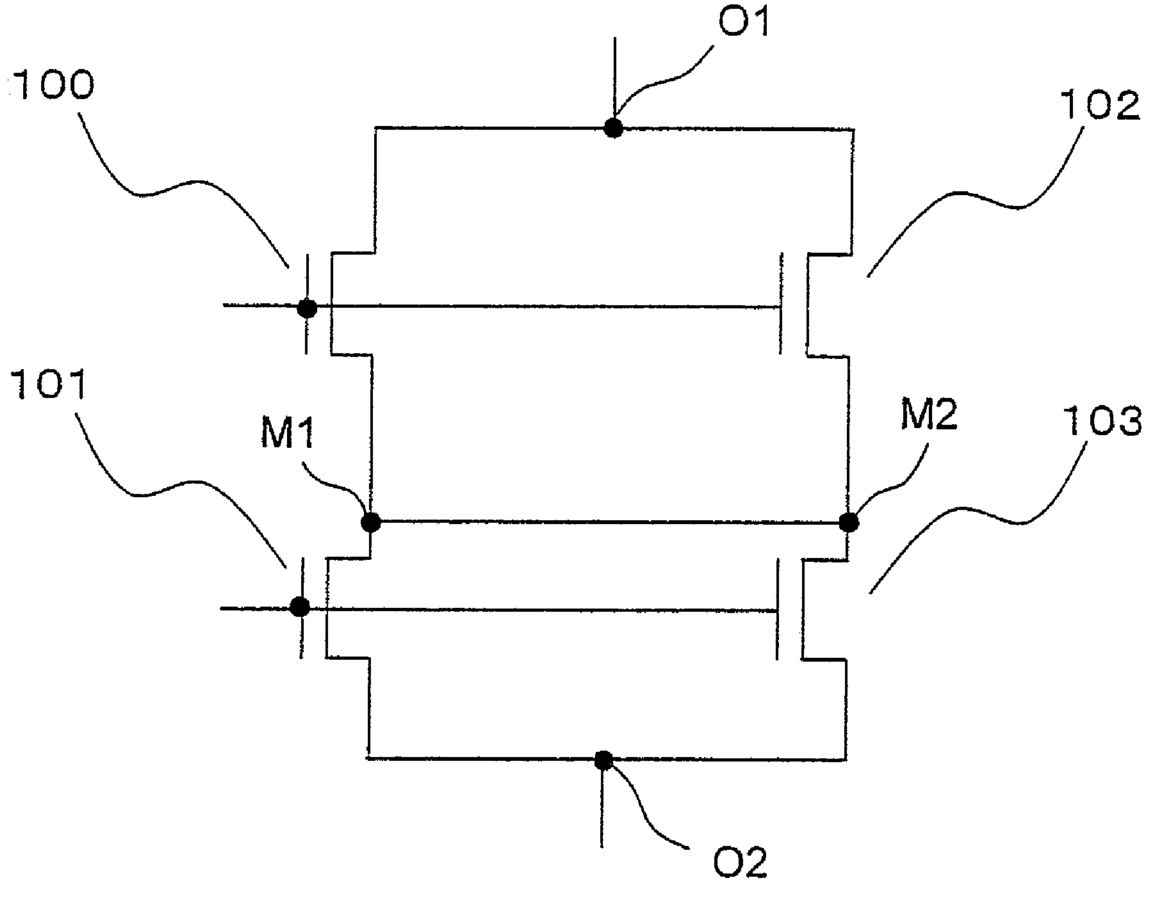
FIG. 3 is a diagram showing a semiconductor device disadvantageous for an off-state current failure.

Moreover, as shown in FIG. 3, in the case of a circuit block, which does not have the n-channel type transistor 104 of FIG. 1 and in which the portion (between the intermediate nodes M1 and M2) is short-circuited, there hold $$\epsilon 3e=1-(1-e^2)^2$$

$$\epsilon 3p=(1-(1-p)^2)^2$$

and, assuming that e=p=1%, there hold $$\epsilon 2e\approx 0.0200\%$$

$$\epsilon 2p\approx 0.0396\%$$

which means that the fraction defective in the case where the transistors are turned off is disadvantageously increased by about two times. However, if the present invention is applied to the construction of the semiconductor device shown in FIG. 3, the fraction defective of the circuit block can also be suppressed low.

As described above, if the construction of the semiconductor device shown in FIG. 1 of the first embodiment is employed, when the n-channel type transistor 104 is in the off state, no current flows there and the circuit becomes equivalent to that of the semiconductor device shown in FIG. 2, providing a construction advantageous when all the transistors are in the off state. On the other hand, when the n-channel type transistor 104 is in the on state, a current flows there and the circuit becomes equivalent to that of the semiconductor device shown in FIG. 3, providing a construction advantageous when all the transistors are in the on state. In either case, the fraction defective can be reduced in a self-aligning manner.

The Second Embodiment

Figure 4:
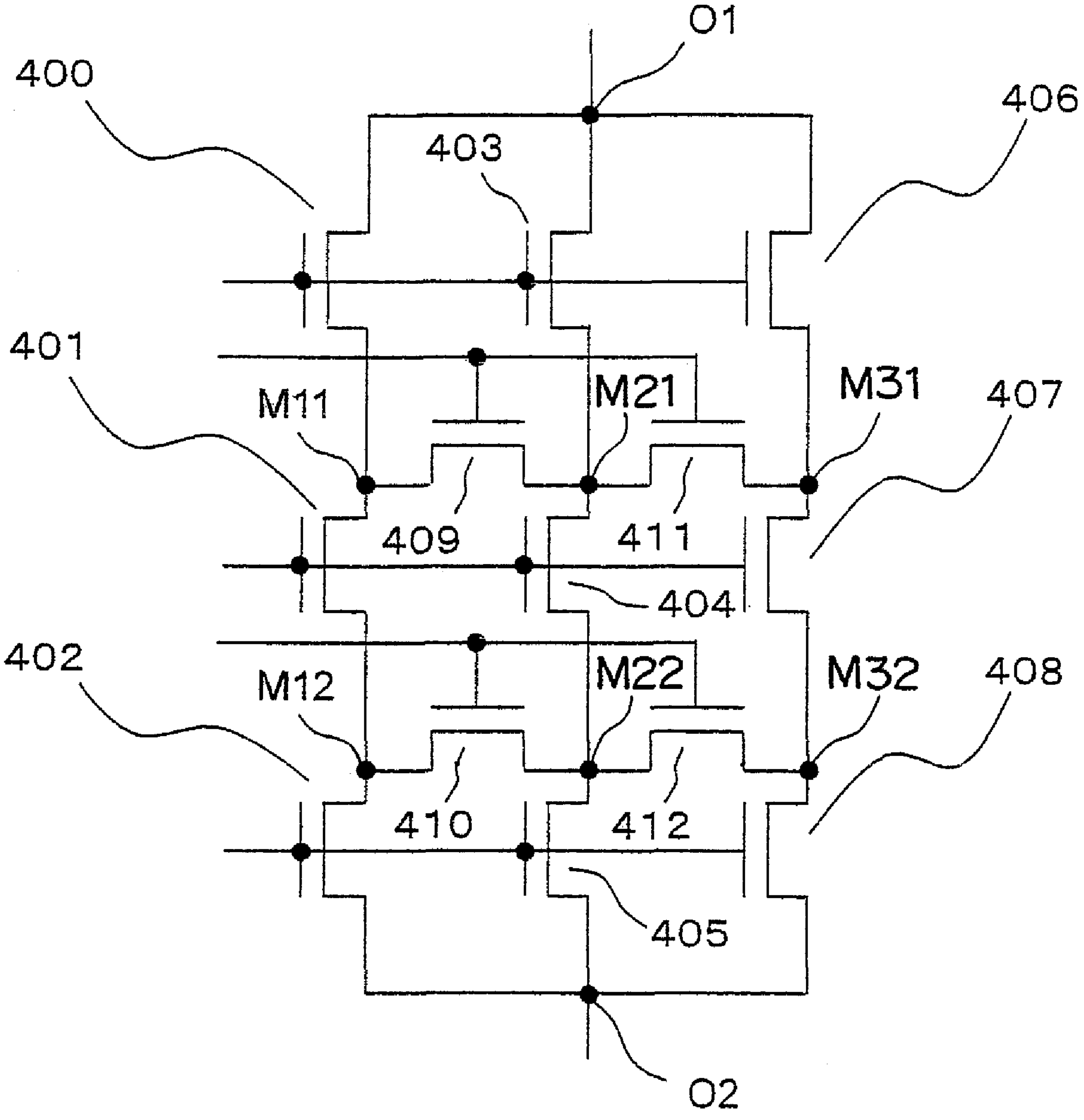
FIG. 4 is a diagram showing a semiconductor device according to a second embodiment of the present invention.

FIG. 4 is a diagram showing a semiconductor device according to the second embodiment of the present invention. As shown in FIG. 4, the semiconductor device has a first transistor column where three n-channel type transistors 400, 401, 402 are connected in series, a second transistor column where three n-channel type transistors 403, 404, 405 are connected in series, and a third transistor column where three n-channel type transistors 406, 407, 408 are connected in series. One terminal of the first through third transistor columns is connected to a first output node O1, and the other terminal of the first through third transistor columns is connected to a second output node O2, the first through third transistor columns being connected in parallel.

Moreover, an intermediate node M11 between the n-channel type transistors 400, 401 of the first transistor column and an intermediate node M21 between the n-channel type transistors 403, 404 of the second transistor column are interconnected via an n-channel type transistor 409. An intermediate node M12 between the n-channel type transistors 401, 402 of the first transistor column and an intermediate node M22 between the n-channel type transistors 404, 405 of the second transistor column are interconnected via an n-channel type transistor 410. Moreover, the intermediate node M21 between the n-channel type transistors 403, 404 of the second transistor column and an intermediate node M31 between the n-channel type transistors 406, 407 of the third transistor column are interconnected via an n-channel type transistor 411. The intermediate node M22 between the n-channel type transistors 404, 405 of the second transistor column and an intermediate node M32 between the n-channel type transistors 407, 408 of the third transistor column are interconnected via an n-channel type transistor 412. The n-channel type transistors 409, 410, . . . , 412 are the intermediate node interconnection transistors.

The n-channel type transistors 400, 401, . . . , 412 constitute one circuit block. In the present invention, the circuit block of the construction as described above is used as a transfer gate.

In the semiconductor device, a control signal for simultaneously turning on and off all the transistors 400, 401, . . . , 412 is inputted to the gates as the control input terminals of all the transistors 400, 401, . . . , 412 of the first through third transistor columns.

When the n-channel type transistors 400, 401, . . . , 412 are all put into the on state by employing the construction of the semiconductor device of the second embodiment shown in FIG. 4, an on-state current fraction defective $\epsilon 4e$ of the circuit block constructed of the transistor group is:

$$\epsilon 4e=(1-e)(1-(1-e)^2)^2+e(1-(1-e^2)^2)$$

and when the n-channel type transistors 400, 401, . . . , 412 are all put into the off state, an off-state current fraction defective $\epsilon 4p$ of the circuit block constructed of the transistor group is:

$$\epsilon 4p=p(1-(1-p)^2)^2+(1-p)(1-(1-p^2)^2)$$

Assuming that e=p=1%, then there holds $$\epsilon 4e=\epsilon 4p\approx 0.00031\%$$

which means that the fraction defective becomes at least about 1/6400 that of the operation of one transistor.

Figure 5:
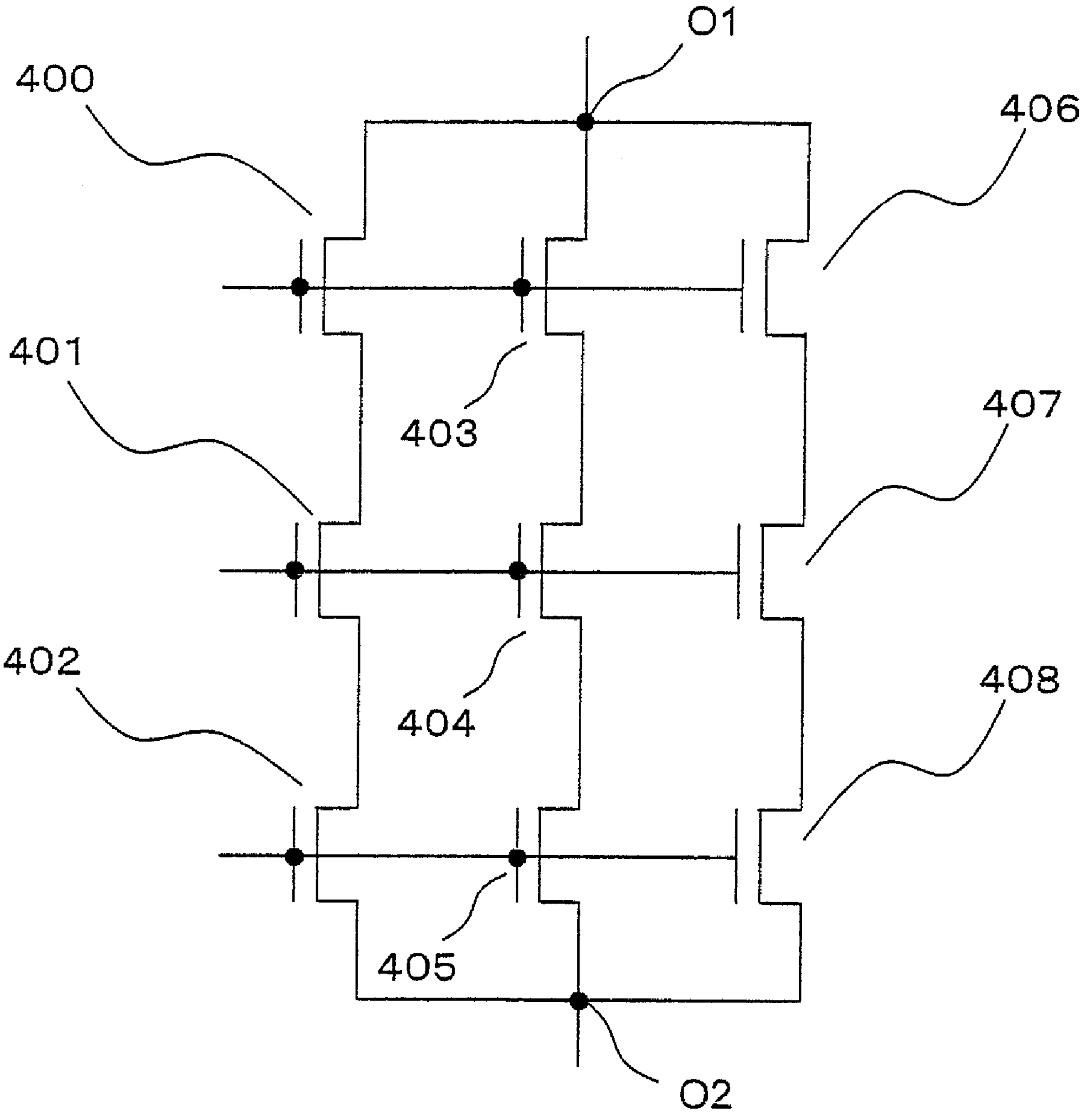
FIG. 5 is a diagram showing a semiconductor device disadvantageous for an on-state current failure.

On the other hand, as shown in FIG. 5, in the case of a circuit block that does not have the transistors 409, 410, . . . , 412 of FIG. 4, there hold $$\epsilon 5e=(1-(1-e)^3)^3$$

$$\epsilon 5p=1-(1-p^3)^3$$

and, assuming that e=p=1%, there hold $$\epsilon 5e\approx 0.00262\%$$

$$\epsilon 5p\approx 0.00030\%$$

which means that the fraction defective when the transistors are turned on is disadvantageously increased by about nine times. However, if the present invention is applied to the construction of the semiconductor device shown in FIG. 5, the fraction defective of the circuit block can be suppressed low.

Figure 6:
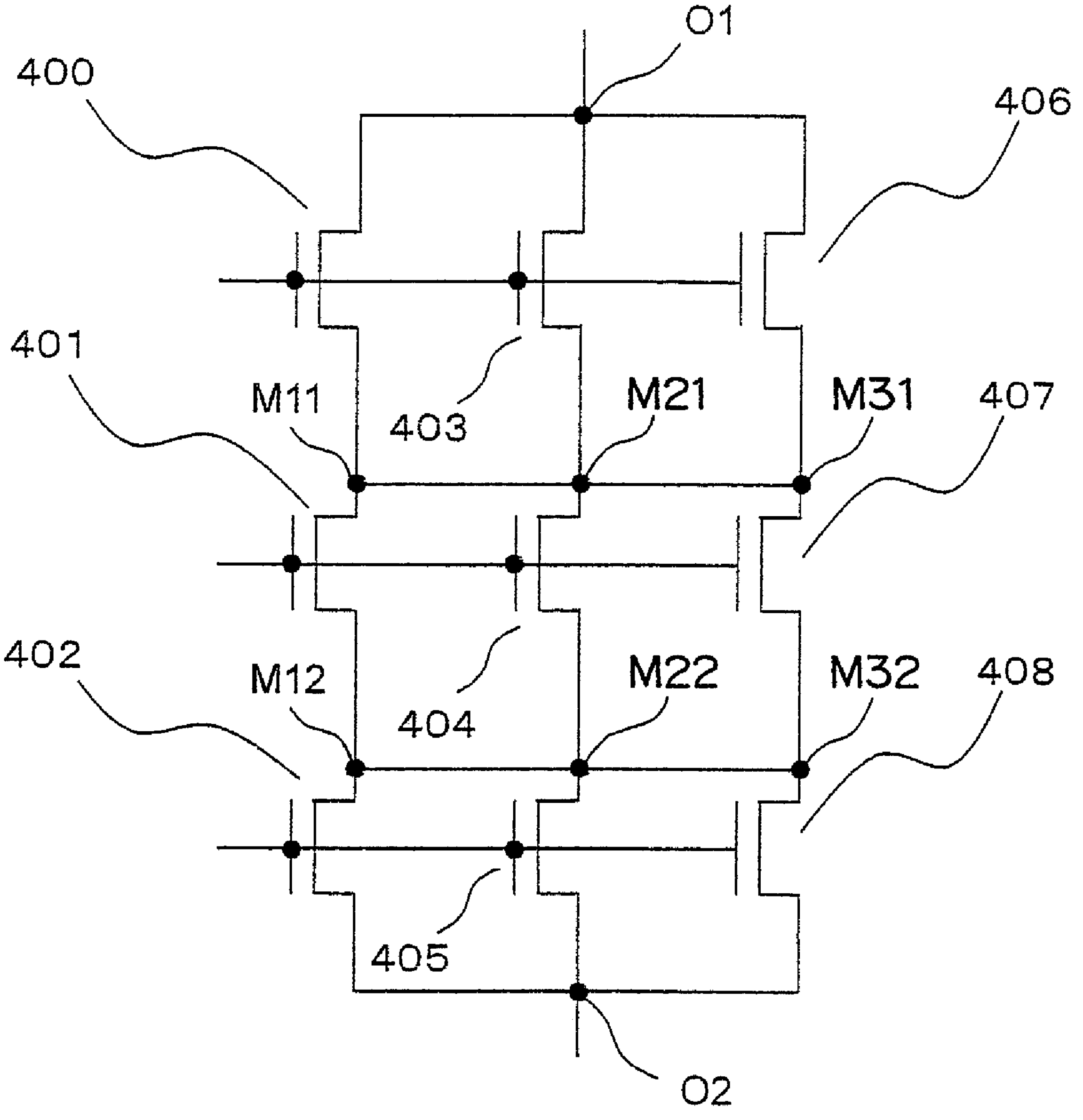
FIG. 6 is a diagram showing a semiconductor device disadvantageous for an off-state current failure.

Moreover, as shown in FIG. 6, in the case of a circuit block, which does not have the n-channel type transistors 409, 410, . . . , 412 of FIG. 4 and in which the portions (between M11 and M21, between M12 and M22, between M21 and M31 and between M22 and M32) are short-circuited, there hold $$\epsilon 6e=1-(1-e^3)^3$$

$$\epsilon 6p=(1-(1-p)^3)^3$$

and, assuming that e=p=1%, then there hold $$\epsilon 2e\approx 0.00030\%$$

$$\epsilon 2p\approx 0.00262\%$$

which means that the fraction defective when the transistors are turned off is disadvantageously increased by about nine times. However, if the present invention is applied to the construction of the semiconductor device shown in FIG. 6, the fraction defective of the circuit block can be suppressed low.

As described above, if the construction of the semiconductor device shown in FIG. 4 of the second embodiment is employed, when the n-channel type transistors 409, 410, . . . , 412 are in the off state, no current flows there and the circuit becomes equivalent to that of the semiconductor device shown in FIG. 5, providing a construction advantageous when all the transistors are in the off state. On the other hand, when the n-channel type transistors 409, 410, . . . , 412 are in the on state, a current flows there and the circuit becomes equivalent to that of the semiconductor device shown in FIG. 6, providing a construction advantageous when all the transistors are in the on state. In either case, the fraction defective can be reduced in a self-aligning manner.

The Third Embodiment

Figure 7:
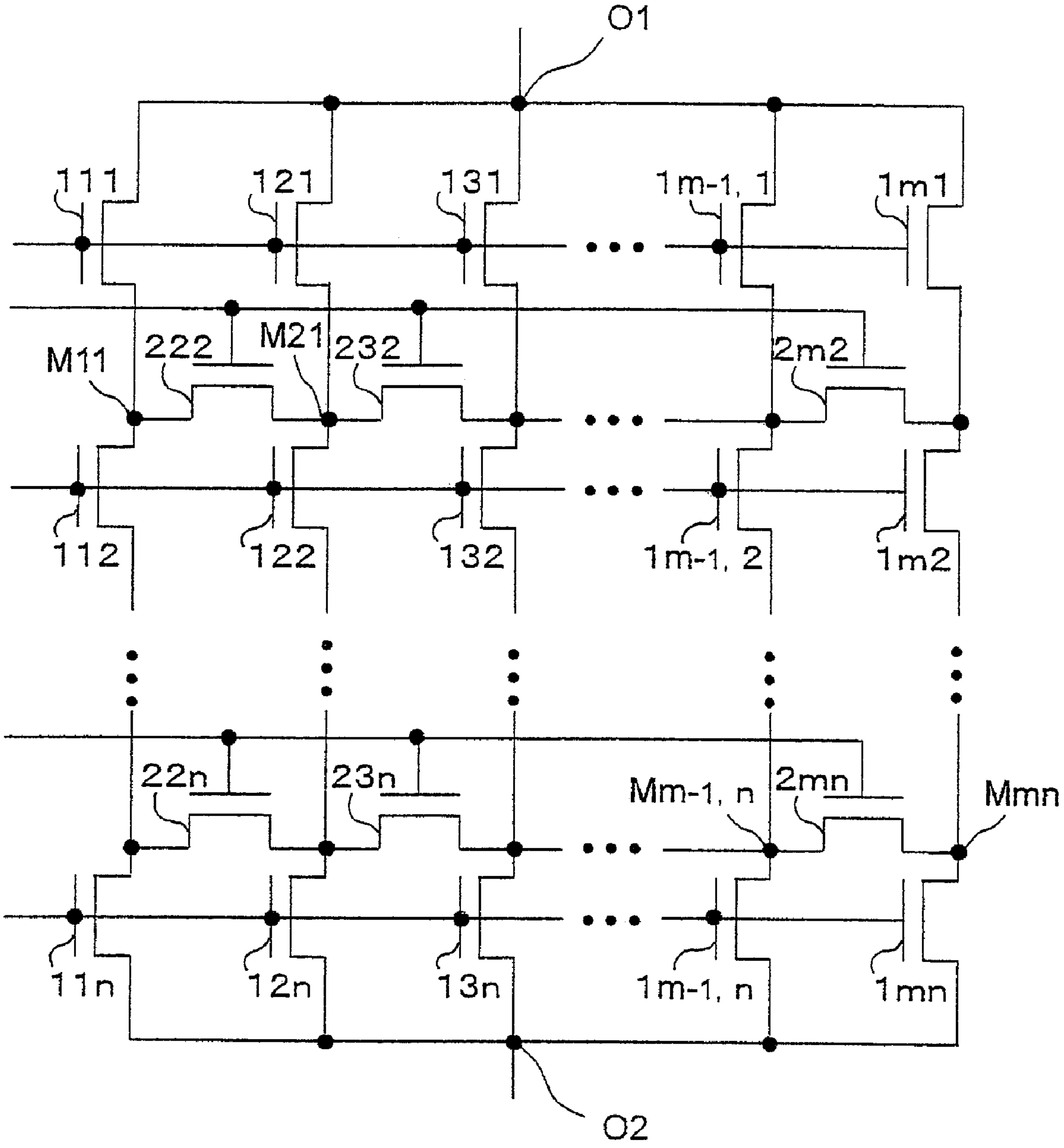
FIG. 7 is a diagram showing a semiconductor device according to a third embodiment of the present invention.

FIG. 7 is a diagram showing a semiconductor device according to the third embodiment of the present invention.

As shown in FIG. 7, the semiconductor device has a first transistor column where n (n is an integer of not smaller than two) n-channel type transistors 111, 112, . . . , 11*n* are connected in series, a second transistor column where n n-channel type transistors 121, 122, . . . , 12*n* are connected in series, . . . , and an m-th (m is an integer of not smaller than two) transistor column where n n-channel type transistors 1*m*1, 1*m*2, . . . , 1*mn* are connected in series. One terminal of the first through m-th transistor columns is connected to a first output node O1, and the other terminal of the first through m-th transistor columns is connected to a second output node O2, the first through m-th transistor columns being connected in parallel.

Moreover, (n−1)×(m−1) n-channel type transistors 222, . . . , 22*n*; 232, . . . , 23*n*; . . . ; 2*m*2, . . . , 2*mn* provide interconnections between mutually adjacent intermediate nodes M11 and M21, . . . , and between intermediate nodes Mm−1,n and Mmn, respectively, of the transistor columns. The n-channel type transistors 222, . . . , 22*n*; 232, . . . , 23*n*; . . . ; 2*m*2, . . . , 2*mn* are the intermediate node interconnection transistors. It is noted that Mm−1,n represents the n-th intermediate node of the (m−1)-th column. The n-channel type transistors 111, 112, . . . , 1*mn*; 222, . . . , 22*n*; 232, . . . , 23*n*; . . . ; 2*m*2, . . . , 2*mn* constitute one circuit block. In the present invention, the circuit block of the construction as described above is used as a transfer gate.

In the semiconductor device, a control signal for simultaneously turning on and off all the transistors 111, . . . , 1*mn*; 222, . . . , 22*n*; 232, . . . , 23*n*; . . . ; 2*m*2, . . . , 2*mn* is inputted to the gates as the control input terminals of all the transistors 111, 112, . . . , 1*mn*; 222, . . . , 22*n*; 232, . . . , 23*n*; . . . ; 2*m*2, . . . , 2*mn* of the first through m-th transistor columns.

Also in FIG. 7, low fraction defective can be achieved when the transistors are turned either on or off as in the first embodiment and the second embodiment.

Figure 8:
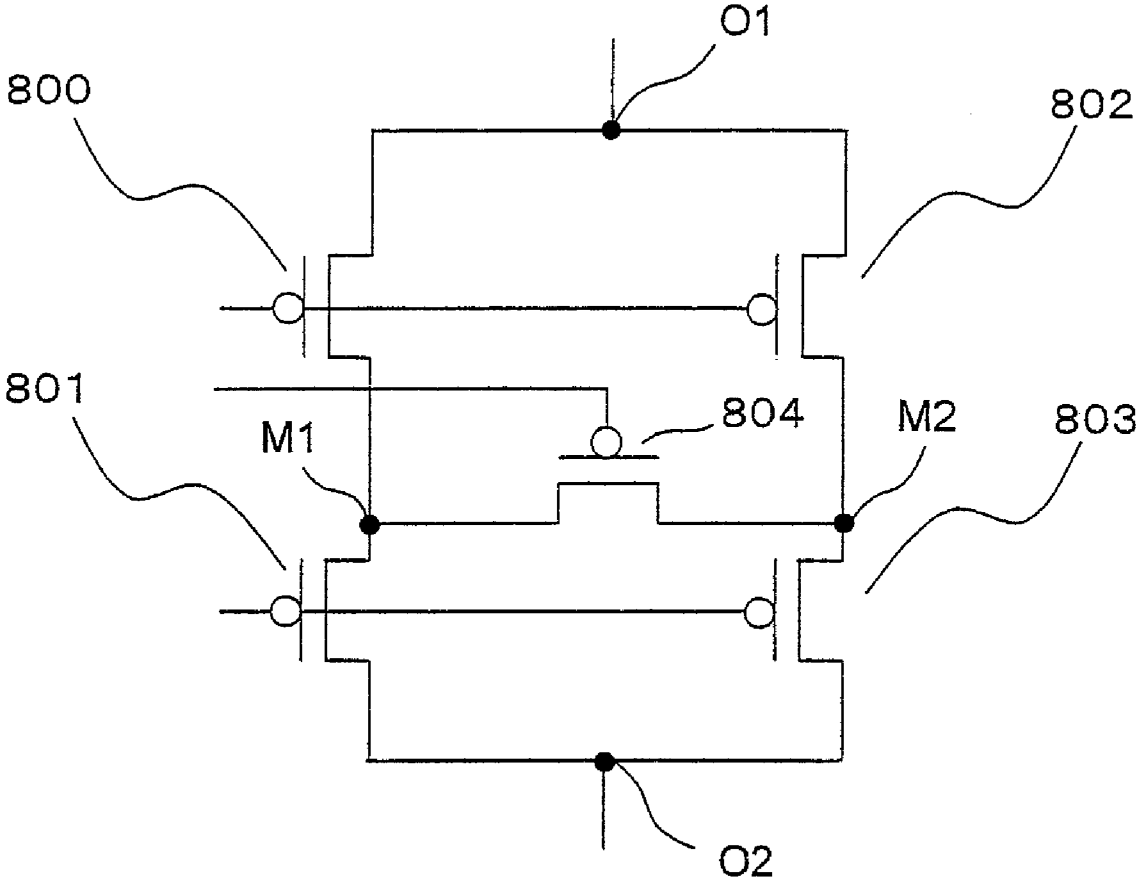
FIG. 8 is a diagram showing a semiconductor device that employs p-channel type transistors of the present invention.
Figure 13:
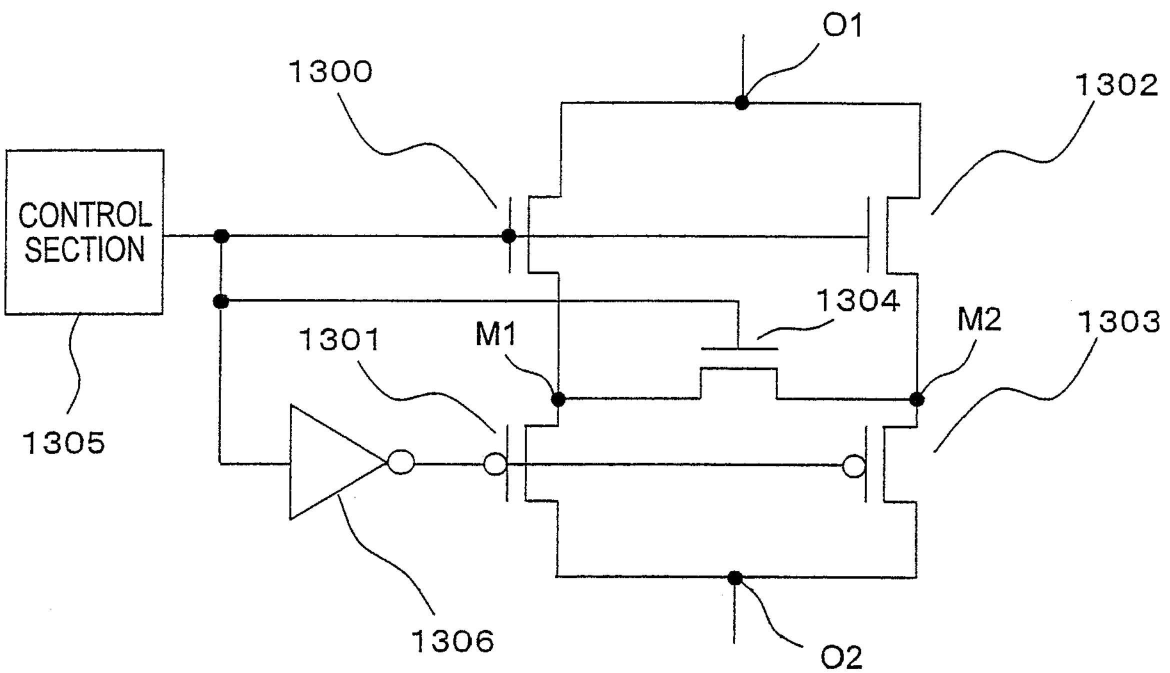
FIG. 13 is a diagram showing a semiconductor device of a construction in which the conductive types of the present invention are mixed.
Figure 14:
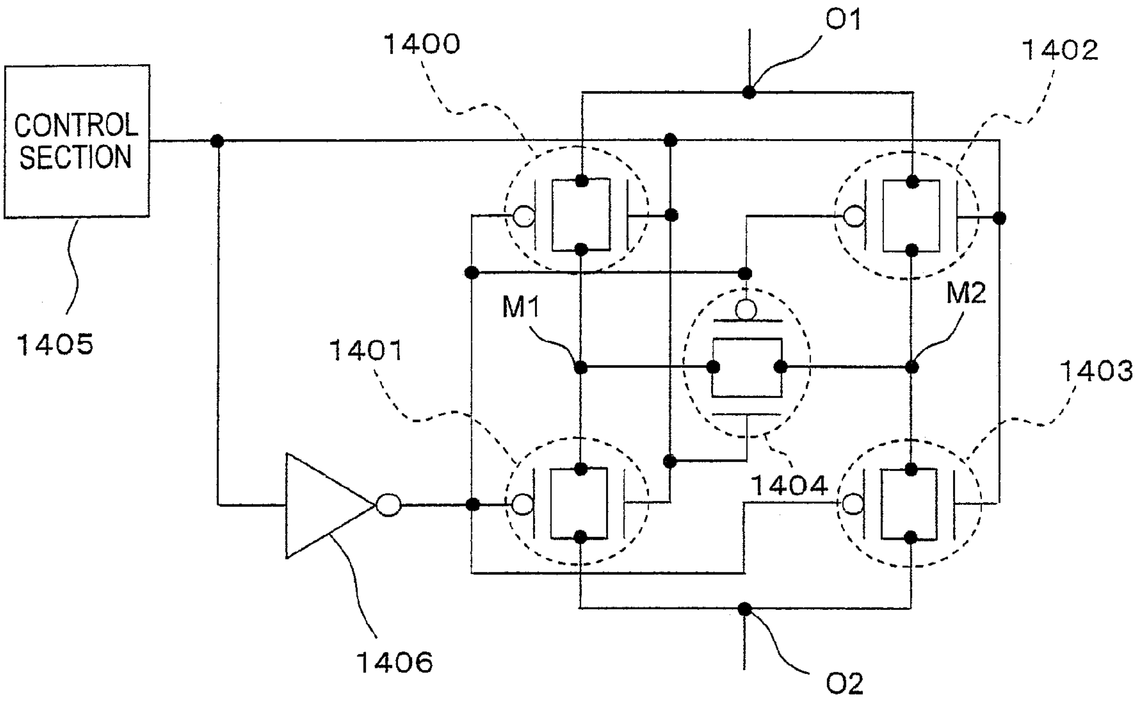
FIG. 14 is a diagram showing a semiconductor device of a construction in which the n-channel type transistor and the p-channel type transistor of the present invention are paired.

Although the transistors are represented by the n-channel type in the first through third embodiments, the transistors are allowed to be the p-channel type as in FIG. 8 or to have a construction in which different conductive types are mixed as shown in FIG. 13. Otherwise, as shown in FIG. 14, there may be a construction in which the n-channel type transistor and the p-channel type transistor are paired. Alternatively, there may be a construction in which some of the transistors of the semiconductor devices of FIGS. 1 through 8, 13 and 14 are eliminated.

The semiconductor device shown in FIG. 8 has a first transistor column where two p-channel type transistors 800, 801 are connected in series, and a second transistor column where two p-channel type transistors 802, 803 are connected in series. One terminal of the first and second transistor columns is connected to a first output node O1, and the other terminal of the first and second transistor columns is connected to a second output node O2, the first and second transistor columns being connected in parallel. Moreover, an intermediate node M1 between the p-channel type transistors 800,801 of the first transistor column and an intermediate node M2 between the p-channel type transistors 802, 803 of the second transistor column are interconnected via a p-channel type transistor 804. In the present invention, the circuit block of the construction as described above is used as a transfer gate. The p-channel type transistor 804 is the intermediate node interconnection transistor. The p-channel type transistors 800, 801, . . . , 804 constitute one circuit block.

Moreover, the semiconductor device shown in FIG. 13 has a first transistor column where an n-channel type transistor 1300 and a p-channel type transistor 1301 are connected in series, and a second transistor column where an n-channel type transistor 1302 and a p-channel type transistor 1303 are connected in series. One terminal of the first and second transistor columns is connected to a first output node O1, and the other terminal of the first and second transistor columns is connected to a second output node O2, the first and second transistor columns being connected in parallel. Moreover, an intermediate node M1 between the n-channel type transistor 1300 and the p-channel type transistor 1301 of the first transistor column and an intermediate node M2 between the n-channel of the second transistor column are interconnected via an n-channel type transistor 1304. The n-channel type transistor 1304 is the intermediate node interconnection transistor.

The n-channel type transistors 1300, 1302, 1304 and the p-channel type transistors 1301, 1303 constitute one circuit block. In the present invention, the circuit block of the construction as described above is used as a transfer gate.

It is noted that a control signal is inputted from a control section 1305 to the gates of the n-channel type transistors 1300, 1302, 1304 of the circuit block, and a signal obtained by inverting the control signal by an inverter 1306 is inputted to the gates of the p-channel type transistors 1301, 1303. By this operation, the n-channel type transistors 1300, 1302, 1304 and the p-channel type transistors 1301, 1303 are simultaneously turned on and off.

Moreover, the semiconductor device shown in FIG. 14 employs transistor pairs 1400, 1401, . . . , 1404 of a construction in which an n-channel type transistor and a p-channel type transistor are paired. The semiconductor device has a first transistor column where the transistor pairs 1400, 1401 are connected in series, and a second transistor column where the transistor pairs 1402, 1403 are connected in series. One terminal of the first and second transistor columns is connected to a first output node O1, and the other terminal of the first and second transistor columns is connected to a second output node O2, the first and second transistor columns being connected in parallel. Moreover, an intermediate node M1 between the transistor pairs 1400, 1401 of the first transistor column and an intermediate node M2 between the transistor pairs 1402, 1403 of the second transistor column are interconnected via a transistor pair 1404. The transistor pair 1404 is the intermediate node interconnection transistor.

The transistor pairs 1400, 1401, . . . , 1404 constitute one circuit block. In the present invention, the circuit block of the construction as described above is used as a transfer gate.

It is noted that a control signal is inputted from a control section 1405 to the gates of the n-channel type transistors of the transistor pairs 1400, 1401, . . . , 1404 of the circuit block, and a signal obtained by inverting the control signal by an inverter 1406 is inputted to the gates of the p-channel type transistors of the transistor pairs 1400, 1401, . . . , 1404. By this operation, the transistor pairs 1400, 1401, . . . , 1404 are simultaneously turned on and off.

The Fourth Embodiment

Figure 9:
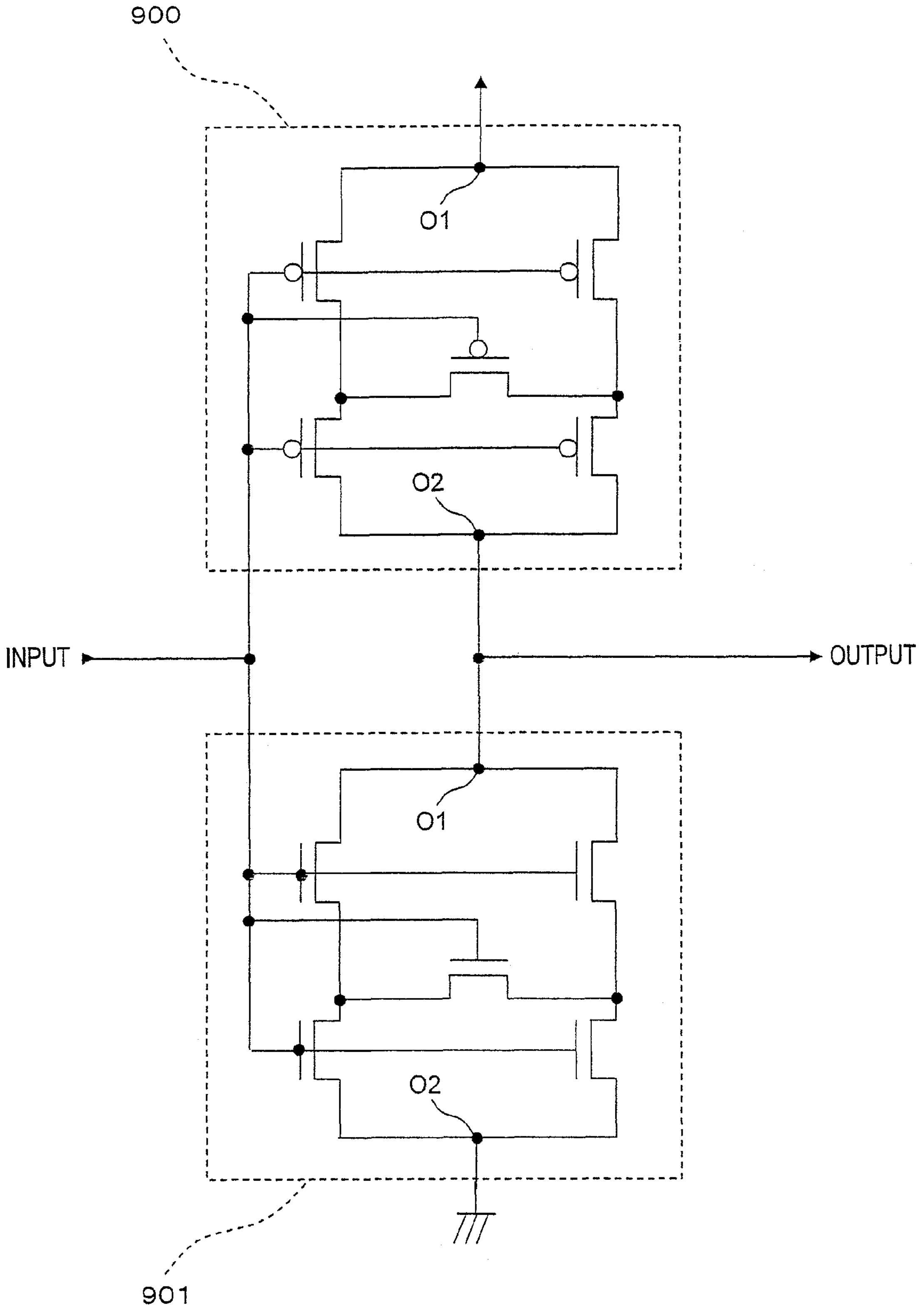
FIG. 9 is a diagram showing a semiconductor device according to a fourth embodiment of the present invention.

FIG. 9 is a diagram showing a semiconductor device according to the fourth embodiment of the present invention. In the semiconductor device, a second output node O2 of a first circuit block 900 that employs p-channel type transistors similar to those of FIG. 8 is connected to a first output node O1 of a second circuit block 901 that employs n-channel type transistors similar to those of FIG. 1. Further, a power source is connected to the first output node O1 of the first circuit block 900, and GND is connected to the second output node O2 of the second circuit block 901. Then, by using the gates of the first and second circuit blocks 900, 901 as one input, the first and second circuit blocks 900, 901 constitute an inverter that outputs a signal obtained by judging the input signal from the first output node O1 of the second circuit block 901.

Also, in the semiconductor device of the fourth embodiment, the first and second circuit blocks 900, 901 can be operated with low fraction defective when the transistors that form the first circuit block 900 and the second circuit block 901 are turned either on or off as in the semiconductor devices of the first through third embodiments. Therefore, an inverter, whose output correctly changes to the low level and the high level with respect to a change to the high level and the low level of the input, can be constituted with high yield.

The Fifth Embodiment

Figure 10:
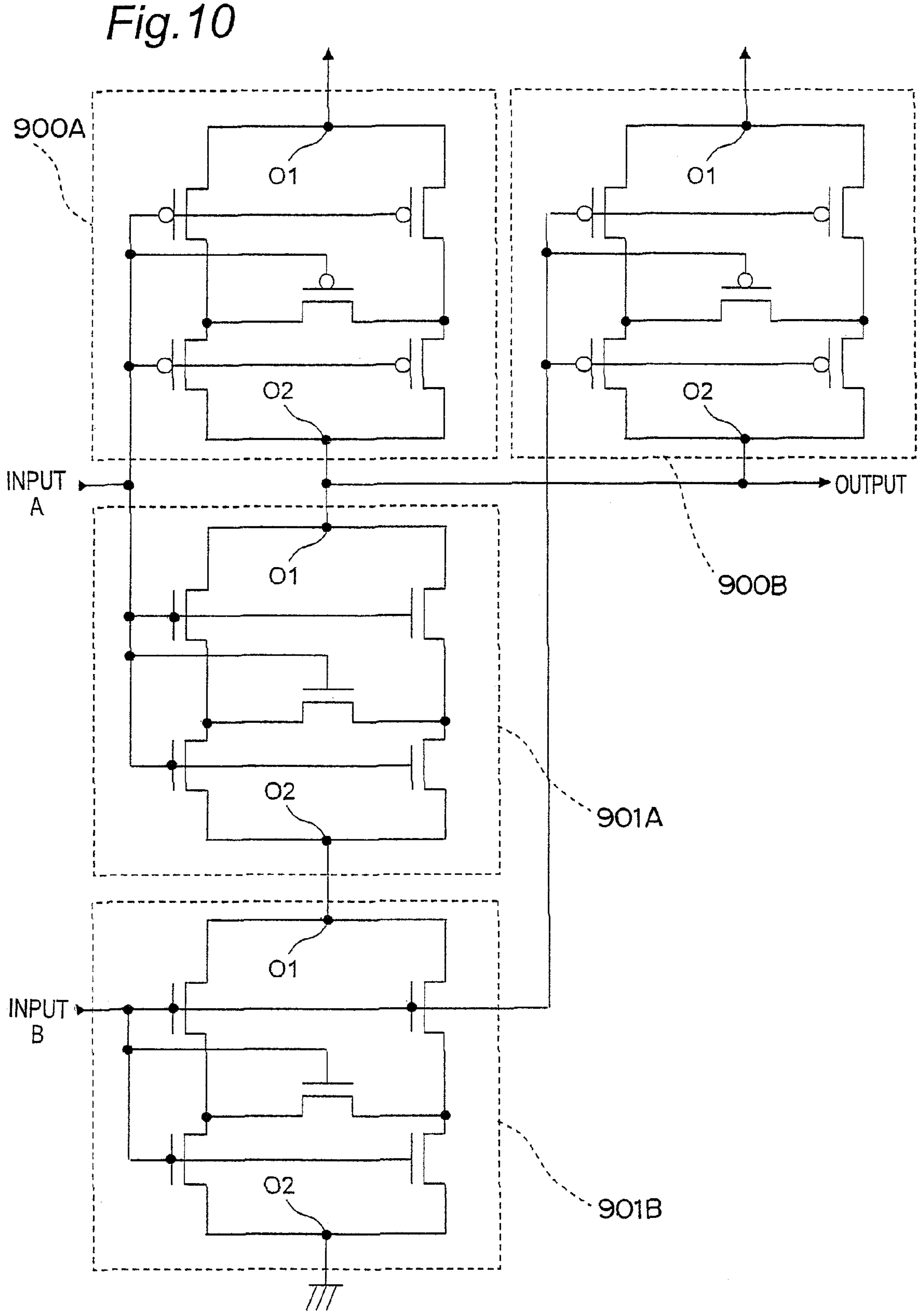
FIG. 10 is a diagram showing a semiconductor device according to a fifth embodiment of the present invention.

FIG. 10 is a diagram showing a semiconductor device according to the fifth embodiment of the present invention. As shown in FIG. 10, the semiconductor device has two first circuit blocks 900 (denoted as 900A, 900B respectively) that employ p-channel type transistors similar to those of FIG. 8, and two second circuit blocks 901 (denoted as 901A, 901B, respectively) that employ n-channel type transistors similar to those of FIG. 1. A second output node O2 of the circuit block 900A is connected to a first output node O1 of the circuit block 901A, and a second output node O2 of the circuit block 901A is connected to a first output node O1 of the circuit block 901B. The second output node O2 of the circuit block 900A is connected to a second output node O2 of the circuit block 900B, and an output is outputted from the second output node O2. Further, a power source is connected to the first output node O1 of each of the two circuit blocks 900A, 900B, and GND is connected to the second output node O2 of the circuit block 901B. Then, by using the gates of the p-channel type transistors of the circuit block 900A and the n-channel type transistors of the circuit block 901A as one input A and using the gates of the p-channel type transistors of the circuit block 900B and the n-channel type transistors of the circuit block 901B as one input B, a NAND (non-conjunction) circuit is constituted.

In the semiconductor device of the fifth embodiment, the circuit blocks constructed of the respective transistor groups can be operated with low fraction defective when the transistors that form the first circuit blocks 900 and the second circuit blocks 901 are turned either on or off as in the semiconductor devices of the first through third embodiments. Therefore, a NAND (non-conjunction) circuit that outputs a signal of high level and low level by correct logic in accordance with the combination of the high level and the low level of the input A and the input B can be constituted with high yield.

Although the first circuit block 900 and the second circuit block 901 of the present invention are employed in all of the fourth embodiment and the fifth embodiment, it is acceptable to employ a circuit block constituted of the transistor groups of FIGS. 4 and 7 constructed of a greater number of transistors. Otherwise, it is acceptable to replace part of them with one transistor, two parallel transistors, two series transistors or transistor groups as shown in FIGS. 2, 3, 5 and 6 in consideration of characteristic variations and so on.

Moreover, although the inverter and the NAND (non-conjunction) circuits are described in connection with the fourth embodiment and the fifth embodiment, logic circuits such as an AND (logical product) circuit, a NOR (non-disjunction) circuit, an OR (logical sum) circuit and an XNOR (exclusive NOR) circuit and more general logic circuits can also be similarly constructed with high yield.

The Sixth Embodiment

Figure 11:
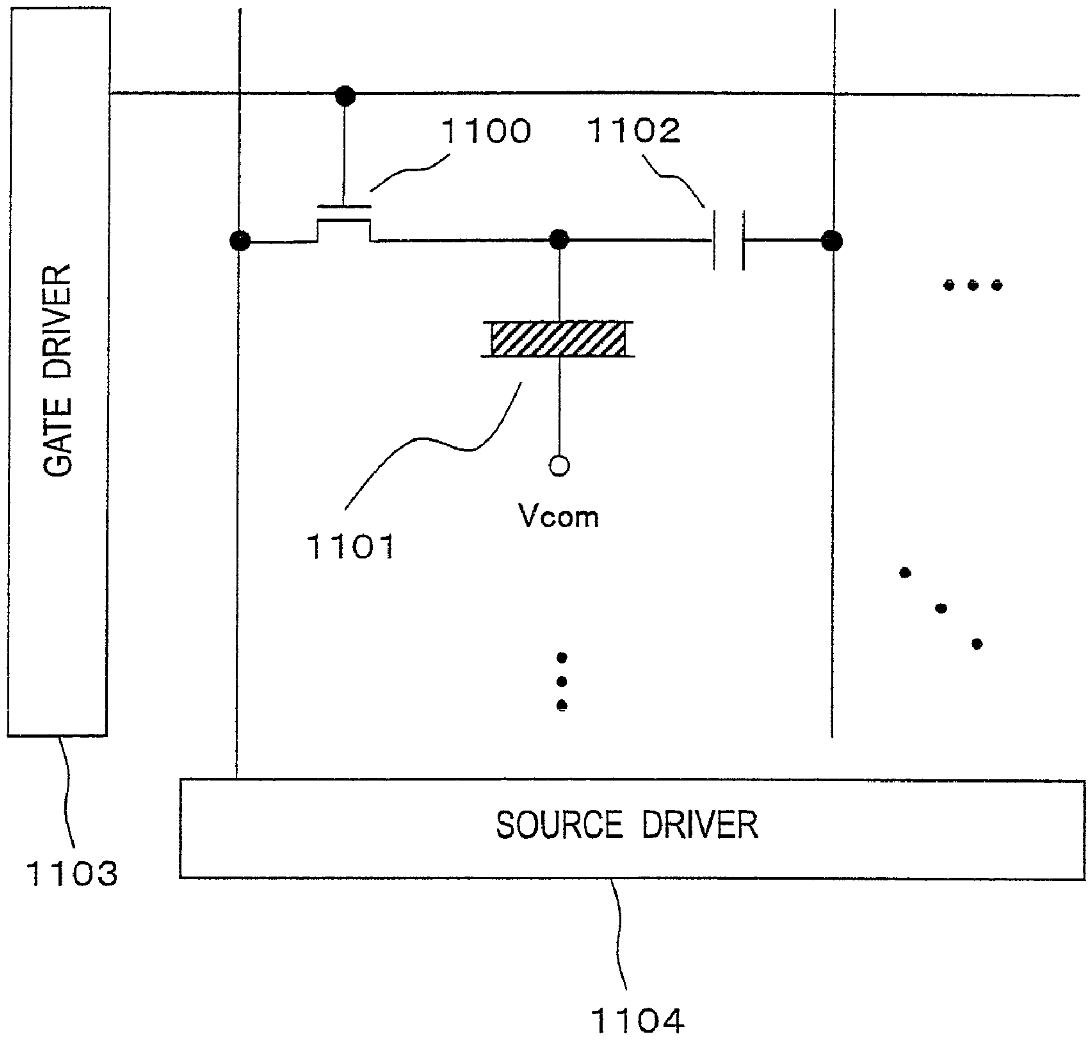
FIG. 11 is a block diagram showing a comparative example of a liquid crystal display device.
Figure 12:
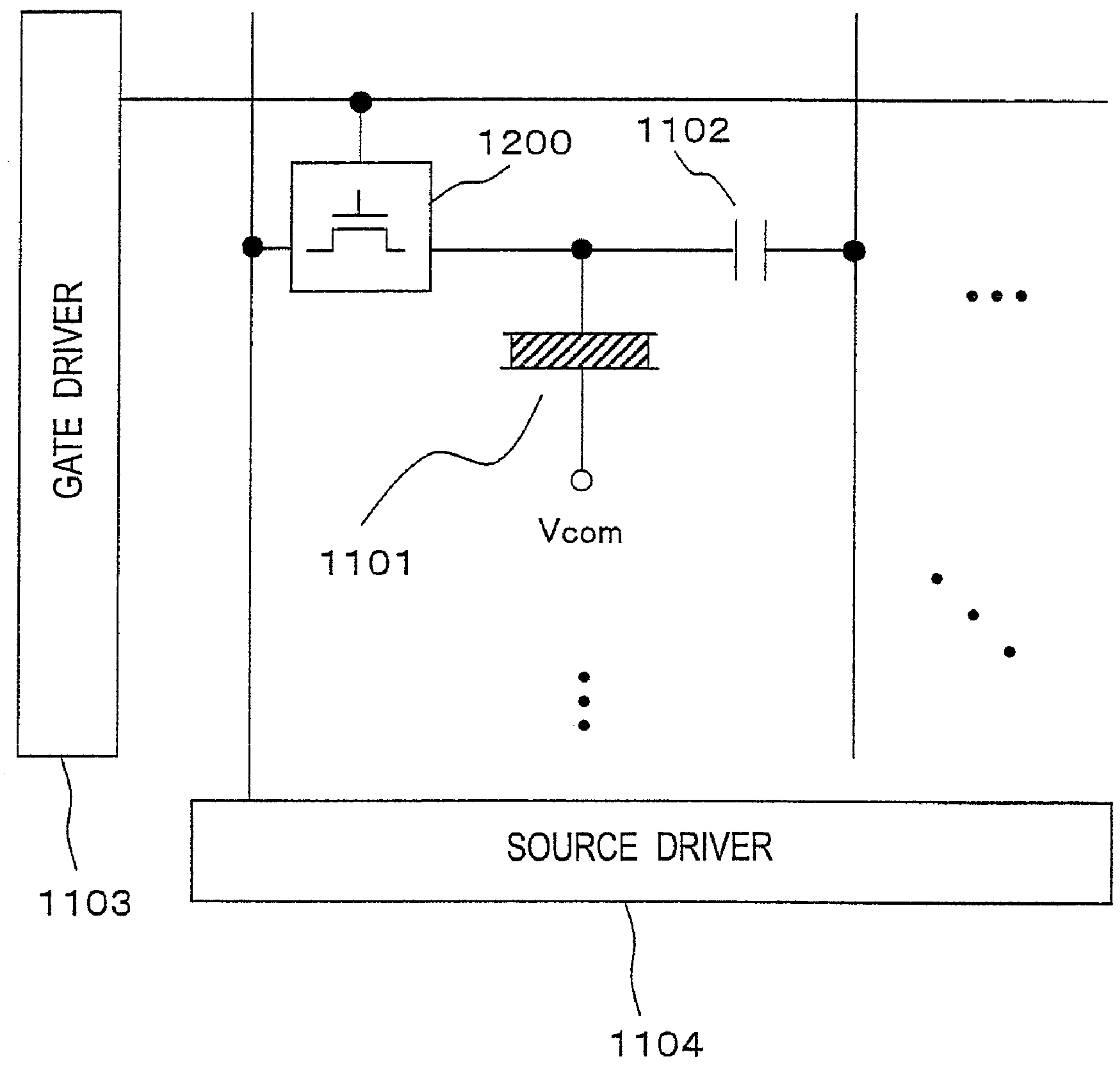
FIG. 12 is a block diagram showing a liquid crystal display device as one example of electronic equipment according to a sixth embodiment of the present invention.

FIG. 11 is a block diagram showing a liquid crystal display device of a comparative example, and FIG. 12 is a block diagram showing a liquid crystal display device as one example of electronic equipment according to the sixth embodiment of the present invention. The liquid crystal display device of FIG. 12 has a circuit block 1200 as the semiconductor device of the present invention, and it is used as TFT.

As shown in FIG. 11, the liquid crystal display device has a TFT 1100, an LCD pixel 1101 and an additional capacitance 1102 arranged in an array form and is constructed of a gate driver 1103 that drives the gate of the TFT 1100 and a source driver 1104 connected to the source of the TFT 1100. The TFT 1100 selected by the gate driver 1103 is turned on, and an analog signal is temporarily stored into the additional capacitance 1102 from the source driver 1104 via the TFT 1100. In order to prevent the deterioration of the LCD pixel 1101, data of a high voltage VH is given in the first half (positive field) of one frame, and data of a low voltage VL is given in the latter half (negative field) of one frame. Then, in order to prevent the flickering of the screen, a voltage of (VH+VL)/2 is applied as a reference voltage to a common voltage Vcom. However, the liquid crystal display device of the comparative example has had a problem that it has manufacturing variations in the on-state current and the off-state current characteristics and so on of the TFTs 1100.

Thus, by providing the circuit block 1200 with the circuit block of the semiconductor device employed in the first through third embodiments as in the liquid crystal display device shown in FIG. 12, high yield can be obtained in terms of the variations in the on-state current and the off-state current characteristics.

Although the liquid crystal display device is described as one example of the electronic equipment in the sixth embodiment, the electronic equipment is not limited to this, and the semiconductor device of the present invention can be applied to electronic equipment of every construction.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A semiconductor device comprising:

a circuit block, which has an m (m is an integer of not smaller than two) sets of first through m-th transistor columns where two or more transistors are connected in series and in which the first through m-th transistor columns have an identical or a varied number of transistors, one terminal of the first through m-th transistor columns is connected to a first output node, and the other terminal of the first through m-th transistor columns is connected to a second output node, wherein the circuit block comprises an intermediate node interconnection transistor for interconnecting at least two intermediate nodes of different transistor columns among the intermediate nodes of the first through m-th transistor columns, and a control signal for substantially simultaneously making all the transistors of the first through m-th transistor columns and the intermediate node interconnection transistor on-state or off-state is inputted to a control input terminal of the transistors of the first through m-th transistor columns and a control input terminal of the intermediate node interconnection transistor.

2. The semiconductor device as claimed in claim 1, wherein in the circuit block, transistor counts of the first through m-th transistor columns are same n (an integer of not smaller than two), the first through m-th transistor columns have first through (n−1)-th intermediate nodes in order from the one terminal, and the circuit block comprises (n−1)×(m−1) intermediate node interconnection transistors that interconnect a j-th (j=1, 2, . . . , (n−1)) intermediate node of an i-th (i=1, 2, . . . , (m−1)) transistor column with the j-th intermediate node of a (i+1)-th transistor column.

3. The semiconductor device as claimed in claim 1, wherein the circuit block comprises:

the first through m-th transistor columns where two transistors are connected in series; and (m−1) intermediate node interconnection transistors that interconnect an intermediate node of an i-th (i=1, 2, . . . , (m−1)) transistor column with an intermediate node of a (i+1)-th transistor column.

4. A semiconductor device as claimed in claim 1, wherein the circuit block comprises:

first through third transistor columns where three transistors are connected in series, the first through third transistor columns having first and second intermediate nodes, respectively, in order from one end;

an intermediate node interconnection transistor for interconnecting the first intermediate node of the first transistor column with the first intermediate node of the second transistor column;

an intermediate node interconnection transistor for interconnecting the second intermediate node of the first transistor column with the second intermediate node of the second transistor column;

an intermediate node interconnection transistor for interconnecting the first intermediate node of the second transistor column with the first intermediate node of the third transistor column; and an intermediate node interconnection transistor for interconnecting the second intermediate node of the second transistor column with the second intermediate node of the third transistor column.

5. The semiconductor device as claimed in claim 1, wherein an n-channel type transistor is employed for every the transistor of the circuit block.

6. The semiconductor device as claimed in claim 1, wherein a p-channel type transistor is employed for every the transistor of the circuit block.

7. The semiconductor device as claimed in claim 1, wherein an inverter is comprised of the circuit block that employs a p-channel type transistor and the circuit block that employs an n-channel type transistor.

8. The semiconductor device as claimed in claim 1, wherein a non-conjunction circuit is comprised of the circuit block that employs a p-channel type transistor and the circuit block that employs an n-channel type transistor.

9. The semiconductor device as claimed in claim 1, wherein a logic circuit is comprised of the circuit block that employs a p-channel type transistor and the circuit block that employs an n-channel type transistor.

10. A liquid crystal display device comprising the semiconductor device claimed in claim 1, wherein a pixel is connected to the first output node or the second output node of the semiconductor device.

11. Electronic equipment comprising the semiconductor device claimed in claim 1.

* * * * *

UNITED STATES PATENT AND TRADEMARK OFFICE

CERTIFICATE OF CORRECTION

PATENT NO. : 7,804,705 B2
APPLICATION NO. : 12/022785
DATED : September 28, 2010
INVENTOR(S) : Hiroshi Iwata et al.

It is certified that error appears in the above-identified patent and that said Letters Patent is hereby corrected as shown below:

ON THE TITLE PAGE:

Insert the following as item (30), Foreign Application Priority Data:

-- (30) Foreign Application Priority Data

Jan. 31, 2007 (JP) ...................... 2007-020865 --.

Signed and Sealed this

Twenty-first Day of December, 2010

David J. Kappos
*Director of the United States Patent and Trademark Office*